United States Patent
Lim

(10) Patent No.: US 9,230,638 B1
(45) Date of Patent: Jan. 5, 2016

(54) SEMICONDUCTOR MEMORY DEVICE INCLUDING PLURALITY OF MEMORY CELLS AND METHOD OF OPERATING THE SAME

(71) Applicant: SK hynix Inc., Icheon (KR)

(72) Inventor: Sang Oh Lim, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/624,789

(22) Filed: Feb. 18, 2015

(30) Foreign Application Priority Data

Oct. 16, 2014 (KR) .................. 10-2014-0140030

(51) Int. Cl.
*G11C 11/34* (2006.01)
*G11C 11/56* (2006.01)
*G11C 16/14* (2006.01)

(52) U.S. Cl.
CPC ............ *G11C 11/5642* (2013.01); *G11C 16/14* (2013.01)

(58) Field of Classification Search
USPC ............. 365/185.03, 185.12, 185.17, 185.18, 365/185.24, 185.29, 185.33
See application file for complete search history.

(56) References Cited

U.S. PATENT DOCUMENTS

| | | | |
|---|---|---|---|
| 7,583,540 B2 * | 9/2009 | Park ...................... | G11C 16/12 365/185.17 |
| 7,643,339 B2 * | 1/2010 | Lee ..................... | G11C 11/5628 365/185.03 |
| 7,684,238 B2 * | 3/2010 | Mo ..................... | G11C 11/5628 365/185.03 |
| 8,537,612 B2 * | 9/2013 | Kang ................. | G11C 11/5621 365/185.03 |
| 8,576,629 B2 * | 11/2013 | Choe .................. | G11C 16/0483 365/185.18 |
| 8,917,548 B2 * | 12/2014 | Edahiro ................. | G11C 16/26 365/185.18 |
| 9,053,978 B2 * | 6/2015 | Nam ................. | H01L 27/11556 |
| 2006/0198201 A1 | 9/2006 | Miwa et al. | |

FOREIGN PATENT DOCUMENTS

| | | |
|---|---|---|
| KR | 10-2010-0070026 A | 6/2010 |
| KR | 10-2013-0030099 A | 3/2013 |

* cited by examiner

*Primary Examiner* — Trong Phan

(57) ABSTRACT

A method includes performing a pre-reading on memory cells selected from a plurality of memory cells according to a pre-read voltage and determining whether the selected memory cells each are read as a first logical value or a second logical value, comparing a number of memory cells read as the first logical value among the selected memory cells with a predetermined number, and when the number of selected memory cells read as the first logical value is smaller than the predetermined number, performing a first main reading of the selected memory cells, the first main reading adapted to read a memory cell that stores multiple bits.

16 Claims, 11 Drawing Sheets

SEMICONDUCTOR MEMORY DEVICE INCLUDING PLURALITY OF MEMORY CELLS AND METHOD OF OPERATING THE SAME

CROSS-REFERENCE TO RELATED APPLICATION

The present application claims priority to Korean Patent Application Number 10-2014-0140030, filed on Oct. 16, 2014, the entire disclosure of which is herein incorporated by reference in its entirety.

BACKGROUND

1. Field of Invention

Embodiments relate to an electronic device, and more particularly, to a semiconductor memory device having a plurality of memory cells and a method of operating the same.

2. Description of Related Art

Semiconductor memory devices are memory devices implemented using semiconductor materials such as silicon (Si), germanium (Ge), gallium arsenide (GaAs), indium phosphide (InP), and the like. The semiconductor memory devices are classified into volatile memory devices and nonvolatile memory devices Volatile memory devices are memory devices in which stored data is lost when their power supplies are interrupted. The volatile memory devices include static random access memories (SRAMs), dynamic RAMs (DRAMs), synchronous DRAMs (SDRAMs), and the like. Nonvolatile memory devices are memory devices that retain stored data even when their power supplies are interrupted. The nonvolatile memory devices include read only memories (ROMs), programmable ROMs (PROMs), erasable programmable ROMs (EPROMs), electrically erasable programmable ROMs (EEPROMs), flash memories, phase-change RAMs (PRAM), magnetic RAMs (MRAMs), resistive RAMs (RRAMs), ferroelectric RAMs (FRAMs), and the like. Flash memories are classified into a NOR type and a NAND type.

SUMMARY

Embodiments are directed to a semiconductor memory device having a reduced area and a method of operating the same.

In an embodiment, a method of operating a semiconductor memory device includes performing a pre-reading on memory cells selected from a plurality of memory cells according to a pre-read voltage and determining whether the selected memory cells each are read as a first logical value or a second logical value; comparing a number of memory cells read as the first logical value among the selected memory cells with a predetermined number; and when the number of memory cells read as the first logical value is smaller than the predetermined number, performing a first main reading of the selected memory cells, wherein the first main reading is adapted to read a memory cell that stores multiple bits.

In an embodiment, the plurality of memory cells may store balanced-coded data.

In an embodiment, the predetermined number may be greater than a half of the number of selected memory cells by a reliability value.

In an embodiment, the determining whether the selected memory cells each are read as a first logical value or a second logical includes when a memory cell of the selected memory cells has a threshold voltage lower than or equal to the pre-read voltage, determining that the memory cell is read as the first logical value; and when the memory cell has the threshold voltage greater than the pre-read voltage, determining that the memory cell is read as the second logical value.

In an embodiment, the method may further include when the number of memory cells that are read as the first logical value is greater than or equal to the predetermined number, performing a second main reading of the selected memory cells. The second main reading is adapted to read a memory cell that stores a single bit.

In an embodiment, the pre-read voltage may be included in a voltage range between a first upper program state and a second upper program state, and the memory cell that stores the multiple bits is adapted to have one of an erase state, the first upper program state, the second upper program state, and a third upper program state.

In an embodiment, the pre-read voltage may be included in a voltage range of a lower program state, and a memory cell that stores a single bit is adapted to have one of an erase state and the lower program state.

In an embodiment, a memory system includes a memory cell array including a plurality of memory cells; and a peripheral circuit configured to perform a pre-reading, using a pre-read voltage, on memory cells selected from the plurality of memory cells and perform a main reading on the selected memory cells according to a result of the pre-reading. The peripheral circuit determines whether the selected memory cells are respectively read as a first logical value or a second logical value by performing the pre-reading. When a number of memory cells read as the first logical value among the selected memory cells is smaller than a predetermined number, the peripheral circuit performs a first main reading adapted to read a memory cell that stores multiple bits.

BRIEF DESCRIPTION OF THE DRAWINGS

The above and other features and advantages of the present invention will become more apparent to those of ordinary skill in the art by describing in detail illustrative embodiments thereof with reference to the attached drawings in which.

DETAILED DESCRIPTION

Hereinafter, illustrative embodiments will be described in detail with reference to the accompanying drawings. The following descriptions focus on configurations necessary for understanding operations according to the embodiments. Therefore, descriptions of other configurations that might obscure the gist of the disclosure will be omitted. Further, embodiments of the present disclosure may be embodied in different forms and should not be construed as limited to the embodiments set forth herein. The embodiments herein are provided so that concepts of the disclosure may be easily embodied by those skilled in the art.

Throughout this specification, when an element is referred to as being "connected" to another element, this denotes that the element can be "directly connected" to the other element or "indirectly connected" to the other element with other intervening element(s). Throughout this specification, when a certain part "includes" a certain component, this denotes that another component may be further included instead of excluding other components unless otherwise defined.

Figure 1:
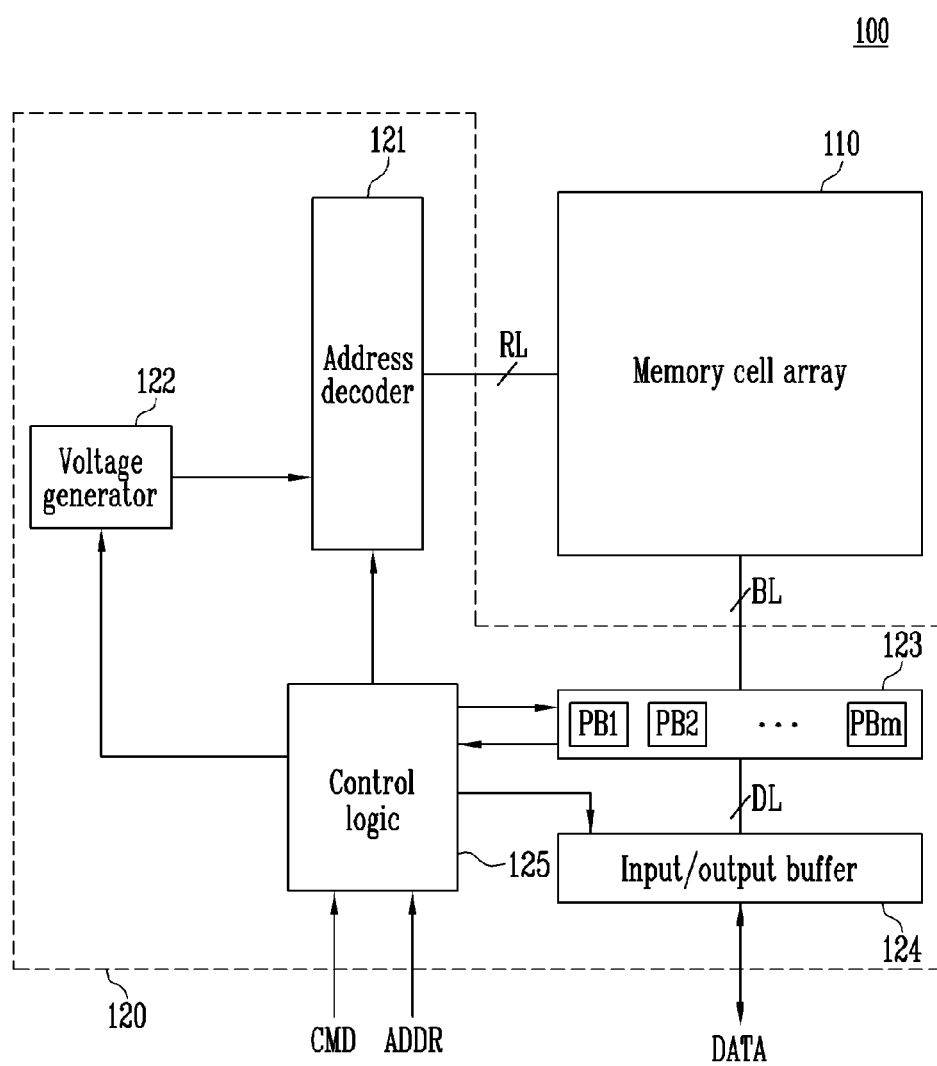
FIG. 1 is a block diagram showing a semiconductor memory device according to an embodiment.
Figure 2:
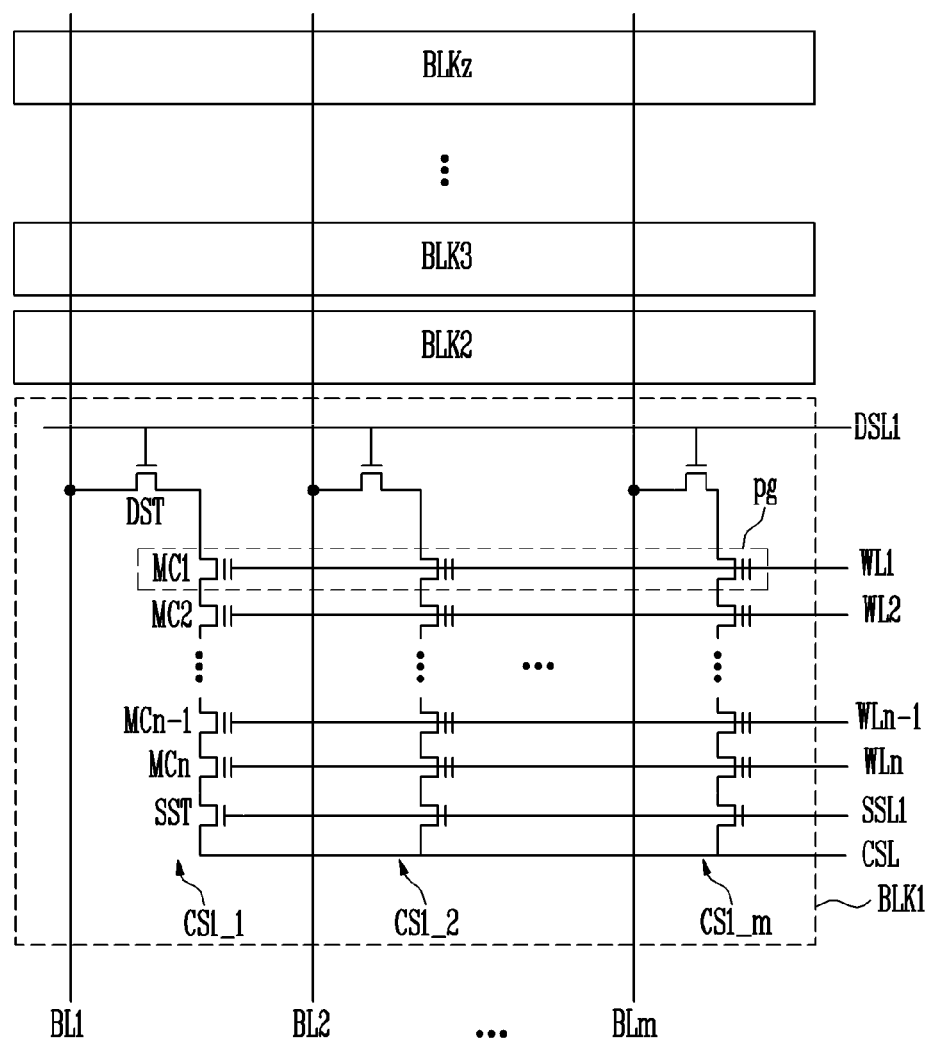
FIG. 2 is a block diagram for describing a memory cell array of FIG. 1 according to an embodiment.

FIG. 1 is a block diagram showing a semiconductor memory device 100. FIG. 2 is a block diagram for describing a memory cell array 110 of FIG. 1.

Referring to FIG. 1, the semiconductor memory device 100 includes the memory cell array 110 and a peripheral circuit 120.

The memory cell array 110 includes a plurality of memory cells. The plurality of memory cells are connected to an address decoder 121 through row lines RL and to a read/write circuit 123 through bit lines BL. In an embodiment, the memory cells of the memory cell array 110 may be nonvolatile memory cells.

Referring to FIG. 2, the memory cell array 110 includes a plurality of memory blocks (first to $z^{th}$ memory blocks BLK1 to BLKz). The first to $z^{th}$ memory blocks BLK1 to BLKz are commonly connected to first to $m^{th}$ bit lines BL1 to BLm. The first to $m^{th}$ bit lines BL1 to BLm are the bit lines BL of FIG. 1. The first to $z^{th}$ memory blocks BLK1 to BLKz each form an erase unit.

In FIG. 2, components included in the first memory block BLK1 of the first to $z^{th}$ memory blocks BLK1 to BLKz are shown, and components included in each of the second to $z^{th}$ memory blocks BLK2 to BLKz are omitted for convenience of description. It will be understood that each of the second to $z^{th}$ memory blocks BLK2 to BLKz are configured in substantially the same manner as the first memory block BLK1.

The first memory block BLK1 includes a plurality of cell strings CS1_1 to CS1_$m$. The first to $m^{th}$ cell strings CS1_1 to CS1_$m$ are connected to the first to $m^{th}$ bit lines BL1 to BLm, respectively.

Each of the plurality of cell strings CS1_1 to CS1_$m$ includes a drain select transistor DST, a plurality of memory cells (first to $n^{th}$ memory cells MC1 to MCn) which are connected to each other in series, and a source select transistor SST. A gate of the drain select transistor DST is connected to a drain select line DSL1. The first to $n^{th}$ memory cells MC1 to MCn are connected to first to $n^{th}$ word lines WL1 to WLn, respectively. A gate of the source select transistor SST is connected to a source select line SSL1. A drain of the drain select transistor DST is connected to a corresponding bit line, that is, the drain select transistors DST of the first to $m^{th}$ cell strings CS1_1 to CS1_$m$ are connected to the first to $m^{th}$ bit lines BL1 to BLm, respectively. A source of the source select transistor SST is connected to a common source line CSL. In an embodiment, the common source line CSL is commonly connected to the first to $z^{th}$ memory blocks BLK1 to BLKz. In an embodiment, the common source line CSL may be biased to a reference voltage during a read operation.

Corresponding memory cells of the first to $m^{th}$ cell strings CS1_1 to CS1_$m$, which are connected to one word line, form one physical page pg.

The drain select line DSL1, the first to $n^{th}$ word lines WL1 to WLn, the source select line SSL1, and the common source line CSL are included in the row lines RL of FIG. 1. The drain select line DSL1, the first to $n^{th}$ word lines WL1 to WLn, the source select line SSL1, and the common source line CSL are controlled by the address decoder 121. The first to $m^{th}$ bit lines BL1 to BLm are controlled by the read/write circuit 123.

Referring again to FIG. 1, the peripheral circuit 120 includes the address decoder 121, a voltage generator 122, the read/write circuit 123, an input/output buffer 124, and a control logic 125.

The address decoder 121 is connected to the memory cell array 110 through the row lines RL. The address decoder 121 is configured to operate in response to signals provided by the control logic 125. The address decoder 121 receives an address ADDR through the control logic 125.

During a program operation or a read operation, the address ADDR includes a block address and a row address.

The address decoder 121 is configured to decode the block address of the received address ADDR. The address decoder 121 selects one memory block of the first to $z^{th}$ memory blocks BLK1 to BLKz according to the decoded block address.

The address decoder 121 is configured to decode the row address of the received address ADDR to select one word line of the selected memory block. During a read operation, the address decoder 121 may apply a read voltage received from the voltage generator 122 to the selected word line and a pass voltage received from the voltage generator 122 to unselected word lines. During a program operation, the address decoder 121 may apply a program voltage received from the voltage generator 122 to the selected word line and a program unselect voltage received from the voltage generator 122 to the unselected word lines.

The voltage generator 122 operates in response to signals provided by the control logic 125. The voltage generator 122 generates an internal power voltage using an external power voltage supplied to the semiconductor memory device 100. The voltage generator 122 regulates the external power voltage to generate the internal power voltage. The generated internal power voltage is provided to the address decoder 121, the read/write circuit 123, the input/output buffer 124, and the control logic 125 for use as an operating voltage of the semiconductor memory device 100.

The voltage generator 122 also generates a plurality of voltages using at least one of the external power voltage and the internal power voltage. In an embodiment, the voltage generator 122 includes a plurality of pumping capacitors which receive the internal power voltage and selectively activates the plurality of pumping capacitors in response to control of the control logic 125 to generate the plurality of voltages. During a read operation, the voltage generator 122 may generate the read voltage and the pass voltage, the pass voltage having a higher voltage than the read voltage. The generated voltages may be provided to the address decoder 121. During a program operation, the voltage generator 122 generates the program voltage and the program unselect voltage, the program voltage having a higher voltage than the program unselect voltage. The generated voltages may be provided to the address decoder 121.

The read/write circuit 123 is connected to the memory cell array 110 through the bit lines BL. The read/write circuit 123 includes a plurality of page buffers (first to $m^{th}$ page buffers PB1 to PBm). The first to $m^{th}$ page buffers PB1 to PBm operate in response to signals provided by the control logic 125.

The first to $m^{th}$ page buffers PB1 to PBm receive and store data DATA from the memory cells (hereinafter, selected memory cells) connected to the selected word line during a read operation. The read data DATA is transferred to the input/output buffer 124 through data lines DL.

The first to $m^{th}$ page buffers PB1 to PBm receive the data DATA through the input/output buffer 124 and the data lines DL and program the received data DATA to the selected memory cells during a program operation.

The input/output buffer 124 is connected to the read/write circuit 123 through the data lines DL. The input/output buffer 124 operates in response to signals provided by the control logic 125. During a read operation, the input/output buffer 124 outputs the data DATA received from the first to $m^{th}$ page buffers PB1 to PBm through the data lines DL to the outside. During a program operation, the input/output buffer 124 transfers the data DATA received from the outside to the first to $m^{th}$ page buffers PB1 to PBm through the data lines DL.

The data DATA received from the outside is balanced-coded data, that is, the data DATA includes substantially the same number of each of a plurality of values that may be expressed in a memory cell. For example, when one bit having a value of either of 0 and 1 is stored in each memory cell, the data DATA includes substantially the same number of bits having a value of 0 and 1, respectively; and when two bits having a value of one of 00, 01, 10, and 11 are stored in each memory cell, the data DATA includes substantially the same number of bit-pairs having each of the values of 00, 01, 10, and 11.

In an embodiment, the data received from a host Host (see FIG. 12) is balanced-coded by a controller 1200 (see FIG. 12), and the balanced-coded data DATA is provided to a semiconductor memory device 100. When the balanced-coded data DATA is stored in the selected memory cells, a threshold voltage distribution of the memory cells of the memory cell array 110 may be uniform. Thus, a disturbance between the memory cells of the memory cell array 110 is reduced, and threshold voltages of the memory cells are prevented from being inadvertently modified. Therefore, reliability of the data stored in the memory cell array 110 is improved.

The control logic 125 receives a command CMD and the address ADDR. The control logic 125 is configured to control the address decoder 121, the voltage generator 122, the read/write circuit 123, and the input/output buffer 124 in response to the received command CMD. The control logic 125 transfers the address ADDR to the address decoder 121.

The peripheral circuit 120 performs a read operation by performing a pre-reading of selected memory cells and a main reading based on a result of the pre-reading. The peripheral circuit 120 determines whether multiple bits are stored or a single bit is stored in each of the selected memory cells according to the pre-reading. Since the balanced-coded data DATA is stored in the selected memory cells, it may be assumed that the threshold voltage distribution of the selected memory cells is uniform. When the pre-reading process is performed using a specific voltage under an assumption that the threshold voltage distribution is uniform, the threshold voltage distribution of the selected memory cells may be estimated, as will be described with reference to FIGS. 4 and 5 in more detail.

According to a result of the determination, the peripheral circuit 120 performs the main reading by performing either a first main reading adapted to read a memory cell that stores multiple bits or a second main reading adapted to read a memory cell that stores a single bit.

In the related arts, flag cells may be provided to each physical page pg (see FIG. 2) of the memory cell array 110. The flag cell may store information about whether a single bit is stored or multiple bits are stored in each of memory cells of a corresponding physical page pg. Inclusion of the flag cell increases a size of the memory cell array 110. In addition, operations for managing the flag cells, for example, a program operation and a read operation with respect to the flag cells, degrade performance of the semiconductor memory device 100.

In an embodiment, the flag cell which stores the information about whether the single bit is stored or the multiple bits are stored in each of the memory cells of the physical page pg is not required. Whether the single bit is stored or the multiple bits are stored in each of the memory cells of the physical page pg is determined according to the pre-reading of the selected memory cells. According to a result of the determination, the main reading is performed. Therefore, performance of the semiconductor memory device 100 is improved while sizes of the memory cell array 110 and the semiconductor memory device 100 are reduced.

Figure 3:
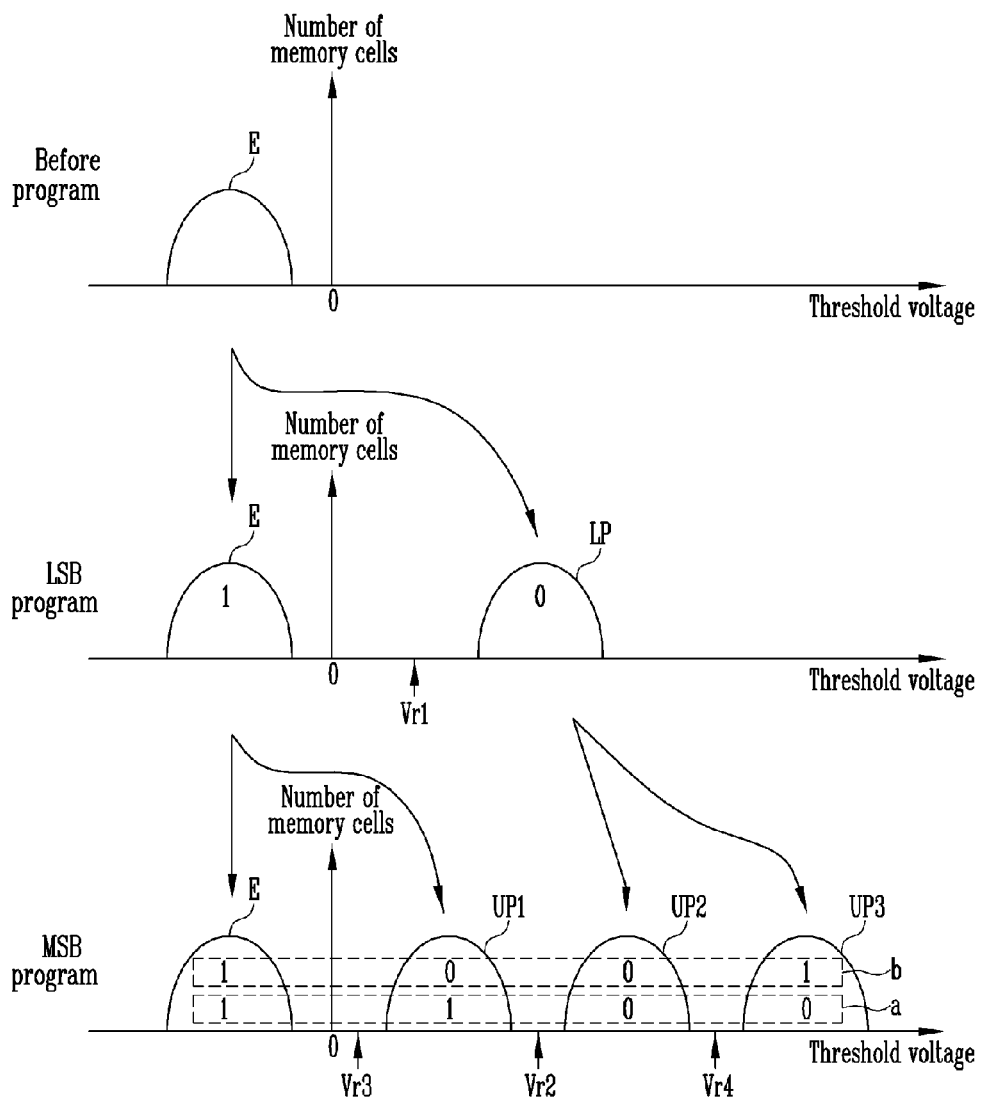
FIG. 3 is a graph showing a threshold voltage distribution of memory cells selected during a least significant bit (LSB) program operation and a most significant bit (MSB) program operation according to an embodiment.

FIG. 3 is a graph showing a threshold voltage distribution of memory cells selected during a least significant bit (LSB) program operation and a most significant bit (MSB) program operation. In FIG. 3, a horizontal axis represents a threshold voltage and a vertical axis represents the number of memory cells.

Referring to FIG. 3, selected memory cells have an erase state E before a program operation. In an embodiment, a voltage range corresponding to the erase state E may be lower than a ground voltage. In an embodiment, the memory cells in the erase state E may be defined to store a logical value "1."

During the LSB program operation, the memory cells in the erase state E are programmed to have the erase state E or a lower program state LP according to data DATA (see FIG. 1) to be programmed as a LSB. That is, each memory cell stores one data bit and a physical page pg corresponding to the selected memory cells includes one logical page. For example, it may be defined that a memory cell in the erase state E stores the logical value "1" and the memory cell in the lower program state LP stores a logical value "0."

Since the programmed data DATA is the balanced-coded data, the number of memory cells in the erase state E may be similar to the number of memory cells in the lower program state LP.

After the LSB program operation, the MSB program operation is performed. The memory cells in the erase state E may be programmed to have the erase state E or a first upper program state UP1, and the memory cells in the lower program state LP may be programmed to have a second upper program state UP2 or a third upper program state UP3 according to data DATA to be programmed as a MSB. Thus, one logical page is added to the physical page pg corresponding to the selected memory cells. That is, each memory cell stores two data bits and a corresponding physical page pg includes two logical pages, that is, a least logical page 'a' and a most logical page 'b', as shown in FIG. 3.

Since the data DATA to be programmed is the balanced-coded data, the respective numbers of the memory cells corresponding to the erase state E and the first to third upper program states UP1 to UP3 may be similar.

In an embodiment, the erase state E may correspond to data "11," the first upper program state UP1 may correspond to data "01," the second upper program state UP2 may correspond to data "00," and the third upper program state UP3 may correspond to data "10." That is, the LSBs of the least logical page 'a' in the erase state E and the first to third upper program states UP1 to UP3 may be defined as "1", "1", "0," and "0," respectively, and the MSBs of the most logical page 'b' in the erase state E and the first to third upper program states UP1 to UP3 may be defined as "1", "0", "0," and "1," respectively.

Figure 4:
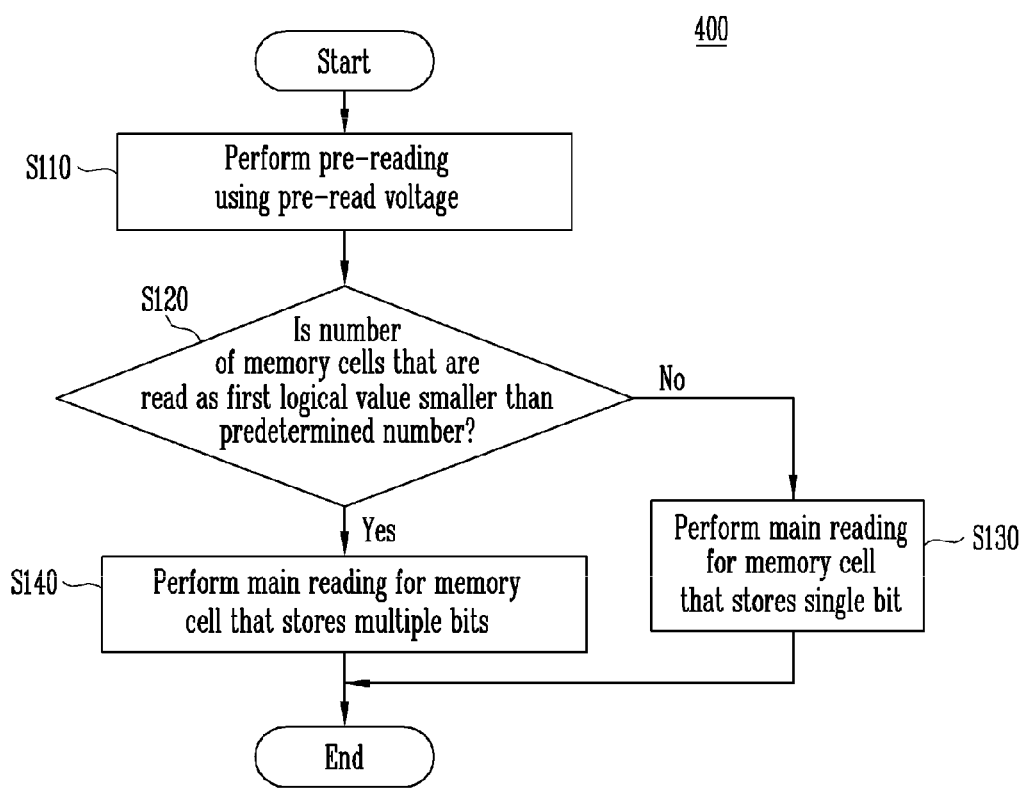
FIG. 4 is a flowchart showing a process for operating a semiconductor memory device according to an embodiment.
Figure 5:
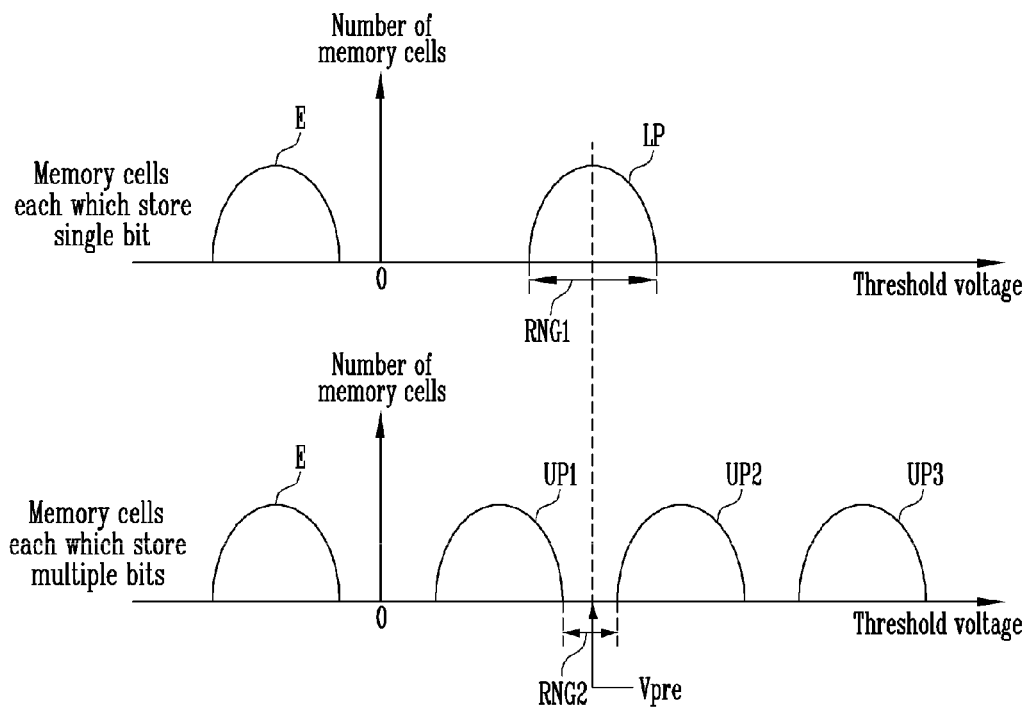
FIG. 5 is a graph for describing a pre-reading according to a pre-read voltage in more detail according to an embodiment.

FIG. 4 is a flowchart showing a process 400 of operating the semiconductor memory device 100 according to an embodiment of the present disclosure. FIG. 5 is a graph for describing a pre-reading according to a pre-read voltage Vpre in more detail First, referring to FIGS. 1, 2, and 4, in operation S110, the peripheral circuit 120 performs the pre-reading on the selected memory cells using the pre-read voltage Vpre (see FIG. 5). When the pre-read voltage Vpre is applied to the selected word line (e.g., WL2) through the address decoder 121, the read/write circuit 123 senses data of the selected memory cells.

In an embodiment, the first to $m^{th}$ bit lines BL1 to BLm are biased to a specific voltage or current. The source select line SSL1 and the drain select line DSL1 are biased so that the source select transistor SST and the drain select transistor DST are turned on. The pre-read voltage Vpre is applied to the selected word line of the word lines WL1 to WLn (for example, the second word line WL2). The pass voltage having a voltage higher than that of the pre-read voltage Vpre is applied to the unselected word lines (e.g., when the second word line WL2 is selected, the first word line WL1 and the third to $n^{th}$ word lines WL3 to WLn) of the word lines WL1 to WLn. In an embodiment, the pass voltage has a voltage higher than a maximum threshold voltage of the memory cells. Because the pass voltage has a voltage higher than a maximum threshold voltage of the memory cells, memory cells connected to the unselected word lines are turned on regardless of the threshold voltages thereof. The selected memory cells are turned on or turned off according to the threshold voltage thereof and the pre-read voltage Vpre. A memory cell that is selected from the selected memory cells and has a threshold voltage higher than the pre-read voltage Vpre is turned off. A memory cell that is selected from the selected memory cells and has a threshold voltage lower than or equal to the pre-read voltage Vpre is turned on. According to whether the selected memory cell is turned on or not, the specific voltage or current provided to bias the first to $m^{th}$ bit lines BL1 to BLm is changed. The voltage or current of the first to $m^{th}$ bit lines BL1 to BLm, respectively, is sensed and thus the data of the selected memory cell is sensed.

Referring to FIG. 5, the pre-read voltage Vpre is included in a voltage range RNG2 between the first upper program state UP1 and the second upper program state UP2. The pre-read voltage Vpre is also included in a voltage range RNG1 in the lower program state LP.

In FIG. 5, the voltage range RNG2 overlaps the voltage range RNG1. Some of memory cells in the lower program state LP may have threshold voltages corresponding to the voltage range RNG2. Some of the memory cells in the lower program state LP may have threshold voltages lower than the pre-read voltage Vpre and the other memory cells may have threshold voltages higher than the pre-read voltage Vpre.

In an embodiment, the MSB program operation may be performed so that the first to third upper program states UP1 to UP3 each are formed in a higher voltage range than shown in FIG. 5. In this case, the voltage range RNG2 may be increased. By increasing the voltage ranges of the first to third upper program states UP1 to UP3, the number of selected memory cells having the lower program state LP that have threshold voltages lower than the pre-read voltage Vpre may be increased.

When the single bit is stored in each of the selected memory cells, the selected memory cells each have one of the erase state E and the lower program state LP. When the pre-reading is performed on the selected memory cells using the pre-read voltage Vpre, the memory cells having a threshold voltage lower than or equal to the pre-read voltage Vpre are read as a first logical value (e.g., logical value "1"). The memory cells having a threshold voltage higher than the pre-read voltage Vpre are read as a second logical value (e.g., logical value "0"). Since the data DATA programmed in each memory cell as the LSB is the balanced-coded data, the number of memory cells corresponding to the erase state E is similar to the number of memory cells corresponding to the lower program state LP as shown in FIG. 5. Because all of the memory cells corresponding to the erase state E have threshold voltages lower than the pre-read voltage Vpre and a substantial portion of the memory cells corresponding to the lower program state LP have threshold voltages lower than the pre-read voltage Vpre, as shown in FIG. 5, the number of memory cells that are read as the first logical value is substantially greater than half of a total number of selected memory cells. For the same reason, the number of memory cells that are read as the second logical value is substantially less than half of the total number of selected memory cells.

When the multiple bits are stored in each of the selected memory cells, the selected memory cells have the erase state E and the upper program states UP1 to UP3. Since the data DATA programmed in each memory cell as the MSB is the balanced-coded data, the numbers of memory cells corresponding to the erase state E and to each of the first to third upper program states UP1 to UP3 are similar. Therefore, the number of memory cells that are read as the first logical value is approximately equal to half the total number of selected memory cells, and the number of memory cells that are read as the second logical value is also approximately equal to half the total number of selected memory cells.

Referring again to FIGS. 1, 2, and 4, in operation S120, the peripheral circuit 120 determines whether the number of memory cells that are read as the first logical value is smaller than a predetermined number. The predetermined number may be a value greater than the half of the total number of selected memory cells (the number of memory cells in one physical page pg) by a reliability value. In an embodiment, when the balanced-coding is performed, the reliability value may be determined according to a margin between the number of bits of the logical value "1" and the number of bits of the logical value "0" and the number of memory cells that are selected from the lower program state LP and have the threshold voltage lower than the pre-read voltage Vpre.

The number of memory cells that are read during the pre-reading as the first logical value being greater than or equal to the predetermined number indicates that the selected memory cells have the erase state E and the lower program state LP, that is, that the single bit is stored in each of the selected memory cells. In this case, operation S130 is performed.

The number of memory cells that are read during the pre-reading as the first logical value being smaller than the predetermined number indicates that the selected memory cells have the erase state E and the first to third upper program states UP1 to UP3, that is, that the multiple bits are stored in each of the selected memory cells. In this case, operation S140 is performed.

In operation S130, the peripheral circuit 120 performs a first main reading, adapted to read the memory cell, which stores the single bit, of the selected memory cells. In operation S140, the peripheral circuit 120 performs a second main reading, adapted to read the memory cell, which stores the multiple bits, of the selected memory cells.

Figure 6:
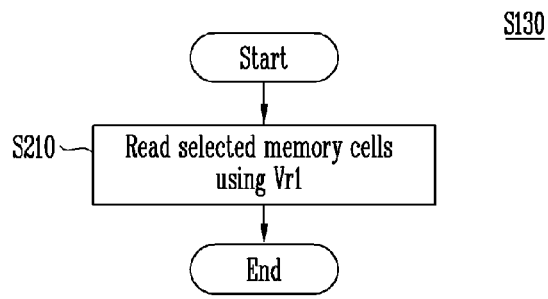
FIG. 6 is a flowchart showing operation S130 of FIG. 4 according to an embodiment.

FIG. 6 is a flowchart showing operation S130 of FIG. 4.

Referring to FIGS. 1 and 6, in operation S210, the peripheral circuit 120 reads data of the selected memory cells using a first read voltage Vr1. That is, the first read voltage Vr1 (see FIG. 3) which is a voltage between the erase state E and the lower program state LP is used during the first main reading adapted to read the memory cell that stores the single bit. The first main reading is performed using the first read voltage Vr1 regardless of whether the received address ADDR indicates the least logical page or the most logical page of the selected memory cells.

In an embodiment, during the first main reading, the first to $m^{th}$ bit lines BL1 to BLm are biased to the specific voltage or current. The source select line SSL1 and the drain select line DSL1 are biased so that the source select transistor SST and the drain select transistor DST are turned on. The first read voltage Vr1 is applied to the selected word line of the word lines WL1 to WLn. The pass voltage is applied to unselected word lines (e.g., when the second word line WL2 is selected, the pass voltage is applied to the first word line WL1 and third to $n^{th}$ word lines WL3 to WLn) of the word lines WL1 to WLn. The memory cells connected to the unselected word lines are turned on according to the pass voltage regardless of the threshold voltages thereof. When the first read voltage Vr1 is applied to the selected word line, the selected memory cells are turned on or turned off according to the threshold voltage thereof. The memory cells in the lower program state LP having the threshold voltage higher than the first read voltage Vr1 are turned off. The memory cells in the erase state E having the threshold voltage lower than the first read voltage Vr1 are turned on. The specific voltage or current biased to the first to $m^{th}$ bit lines BL1 to BLm is changed according to whether each memory cell is turned on or not. The voltage or current of each of the first to $m^{th}$ bit lines BL1 to BLm is sensed and thus the data of the selected memory cells is sensed.

Thus, the memory cells in the erase state E are read as the first logical value. The memory cells in the lower program state LP are read as the second logical value. It is determined that the memory cell that are read as the first logical value stores the logical value "1." It is determined that the memory cell that are read as the second logical value stores the logical value "0."

Figure 7:
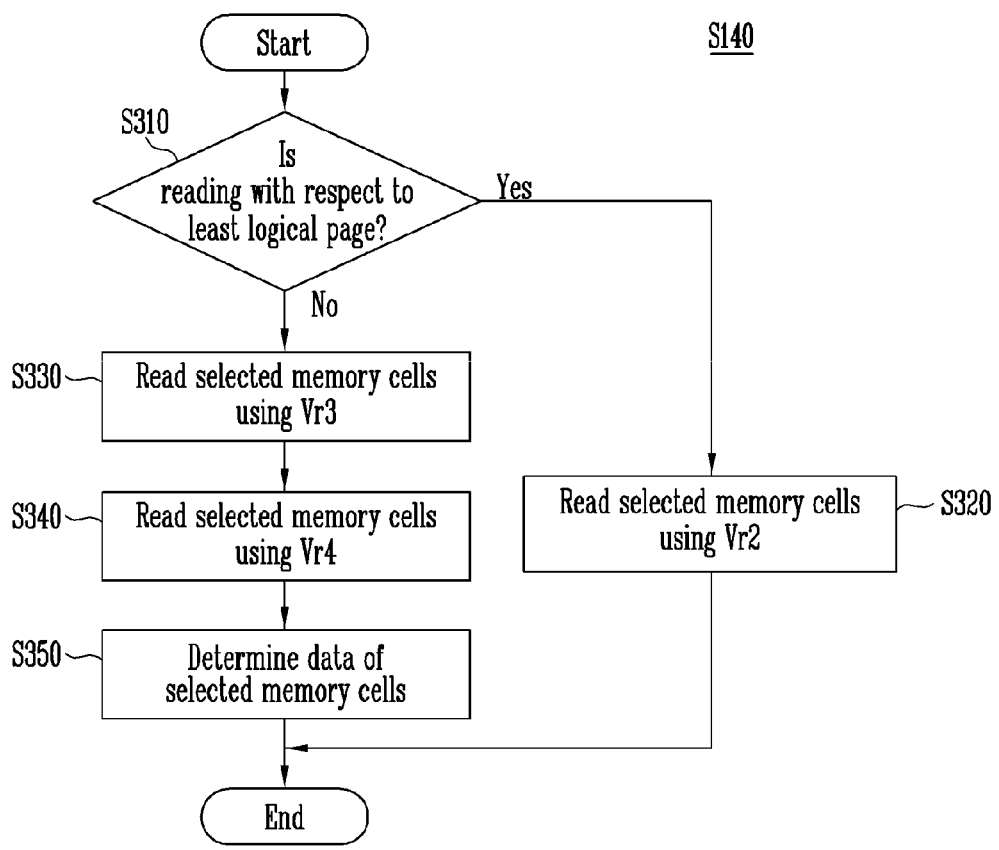
FIG. 7 is a flowchart showing operation S140 of FIG. 4 according to an embodiment.

FIG. 7 is a flowchart showing operation S140 of FIG. 4.

Referring to FIGS. 1 and 7, in operation S310, the peripheral circuit 120 determines whether the address ADDR corresponds to the least logical page or the most logical page of the selected memory cells. When the address ADDR corresponds to the least logical page of the selected memory cells, operation S320 is performed. When the address ADDR corresponds to the most logical page of the selected memory cells, operation S330 is performed.

In operation S320, the peripheral circuit 120 reads the data of the selected memory cells using a second read voltage Vr2 (see FIG. 3).

The second read voltage Vr2 is applied to the selected word line and thus the selected memory cells are read. The memory cells in the erase state E and the first upper program state UP1 are read as the first logical value. The memory cells in the second and third program states UP2 and UP3 are read as the second logical value. The memory cells that are read as the first logical value are determined to store the logical value "1." The memory cells that are read as the second logical value are determined to store the logical value "0." That is, a least significant data bit of each selected memory cell is determined.

In the case in which the address ADDR corresponds to the most logical page of the selected memory cells, the reading may be performed two times.

In operation S330, the peripheral circuit 120 may read the data of the selected memory cells using a third read voltage Vr3 (see FIG. 3). The third read voltage Vr3 is applied to the selected word line to read the selected memory cells. The third read voltage Vr3 is a voltage between the erase state E and the first upper program state UP1. The memory cells corresponding to the erase state E are read as the first logical value. The memory cells of the first to third upper program states UP1 to UP3 are read as the second logical value. The memory cells corresponding to the erase state E may be determined by operation S330.

In operation S340, the peripheral circuit 120 may read the data of the selected memory cells using a fourth read voltage Vr4 (see FIG. 3). The fourth read voltage Vr4 is applied to the selected word line to read the selected memory cells. The memory cells in the erase state E, the first upper program state UP1, and the second upper program state UP2 are read as the first logical value. The memory cells of the third upper program state UP3 are read as the second logical value. The memory cells corresponding to the third upper program state UP3 may be determined by operation S340.

In operation S350, the most significant data bit of each selected memory cell is determined based on the results of operation S330 and operation S340. The read/write circuit 123 determines that memory cells that are read as the second logical value in operation S330 and that are read as the first logical value in operation S340 (the memory cells of the first and second upper program states UP1 and UP2 of FIG. 3) store the logical value "0." The read/write circuit 123 determines that the other memory cells (the memory cells of the erase state E and the third upper program state UP3 of FIG. 3) store the logical value "1."

Figure 8:
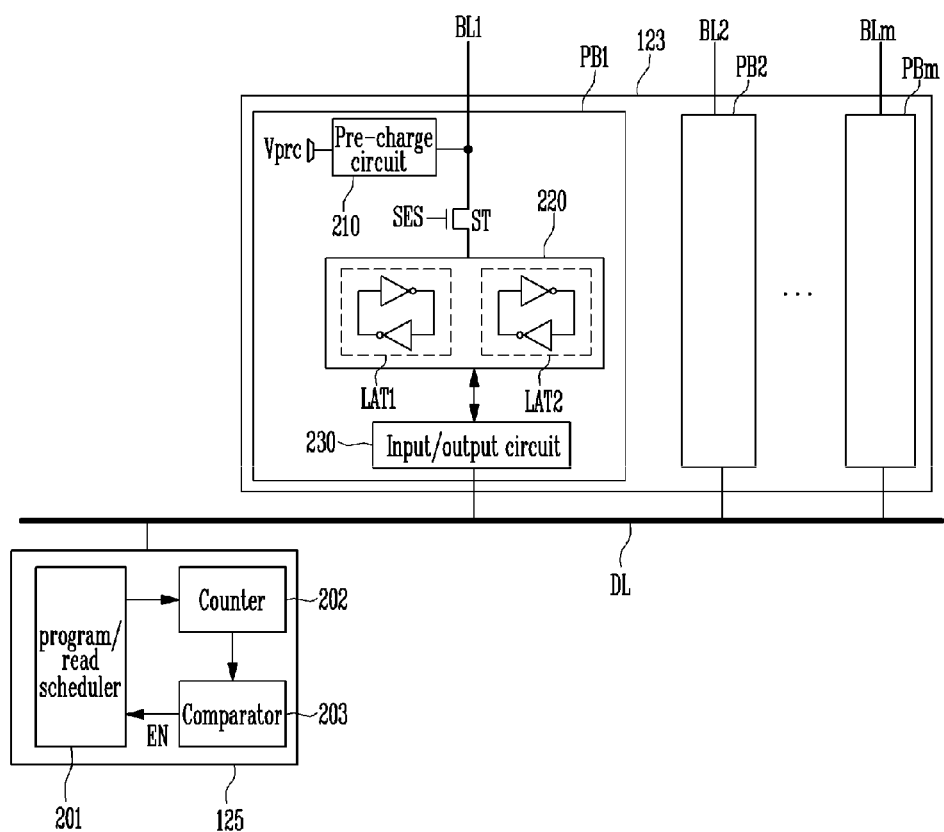
FIG. 8 is a block diagram showing a read/write circuit and a control logic of FIG. 1 according to an embodiment.

FIG. 8 is a block diagram showing the read/write circuit 123 and the control logic 125 of FIG. 1 according to an embodiment. In FIG. 8, components included in the first page buffer PB1 are shown and components included in each of the second to $m^{th}$ page buffers PB2 to PBm are omitted for convenience of descriptions. However, it will be understood that the second to $m^{th}$ page buffers PB2 to PBm each are configured in substantially the same manner as the first page buffer PB1.

Referring to FIG. 8, the first to $m^{th}$ page buffers PB1 to PBm are connected to the first to $m^{th}$ bit lines BL1 to BLm, respectively. In FIG. 8, it is illustrated that each page buffer is connected to one bit line. However, it is only illustrative, it will be understood that the technological scope of embodiments is not limited thereto. In another embodiment, each page buffer may further include a component, which is connected to an even bit line and an odd bit line and selects any one of two bit lines.

The first page buffer PB1 includes a pre-charge circuit 210, a bit line select transistor ST, a sensing circuit 220, and an input/output circuit 230.

The pre-charge circuit 210 is connected to the first bit line BL1. During a read operation, the pre-charge circuit 210 may transfer a pre-charge voltage Vprc to the first bit line BL1 in response to control of the control logic 125 (see FIG. 1). In an embodiment, the pre-charge circuit 210 may include a switching device which operates in response to signals provided by the control logic 125.

The bit line select transistor ST is connected between the first bit line BL1 and the sensing circuit 220. The bit line select transistor ST electrically connects the first bit line BL1 and the sensing circuit 220 in response to a sensing signal SES received from the control logic 125.

The sensing circuit 220 is connected to the first bit line BL1 through the bit line select transistor ST. The sensing circuit 220 includes a plurality of latches LAT1 and LAT2. When the bit line select transistor ST is turned on, the sensing circuit 220 may sense a voltage of the first bit line BL1 and store corresponding data in a first latch LAT1. The data stored in the first latch LAT1 may be transferred to a second latch LAT2. The sensed data is transferred to the input/output circuit 230.

The input/output circuit 230 is connected between the sensing circuit 220 and the data lines DL. The input/output circuit 230 operates in response to signals provided by the control logic 125. The input/output circuit 230 outputs the data of the first latch LAT1 or the second latch LAT2 to the data lines DL in response to the signals provided by the control logic 125. Although not shown in FIG. 8, the data lines DL are connected to the input/output buffer 124.

The control logic 125 includes a program/read scheduler 201, a counter 202, and a comparator 203. The program/read scheduler 201 is configured to control the counter 202 and the comparator 203.

The program/read scheduler 201 is configured to control a program operation and a read operation of the semiconductor memory device 100. The program/read scheduler 201 controls the address decoder 121, the voltage generator 122, the read/write circuit 123, and the input/output buffer 124 in response to the command CMD (see FIG. 1). During a read operation, the program/read scheduler 201 controls the address decoder 121, the voltage generator 122, and the read/write circuit 123 to perform the pre-reading and perform the main reading based on the pre-reading.

During the pre-reading, the program/read scheduler 201 receives the data read through the pre-reading from the first to $m^{th}$ page buffers PB1 to PBm.

The counter 202 is configured to determine a count of the number of bits of the selected data having the first logical value and transferred from the first to $m^{th}$ page buffers PB1 to PBm. In an embodiment, the counter 202 receives a sequence of values and increments a count value when a value of the sequence of values is the first logical value. In an embodiment, the counter 202 includes a plurality of adder circuits configured to sum the number of bits of the selected data having the first logical value. The comparator 203 compares the count value determined by the counter 202 with a predetermined number and enables an enable signal EN according to a result of the comparison. The main reading is performed according to the enable signal EN.

Figure 9:
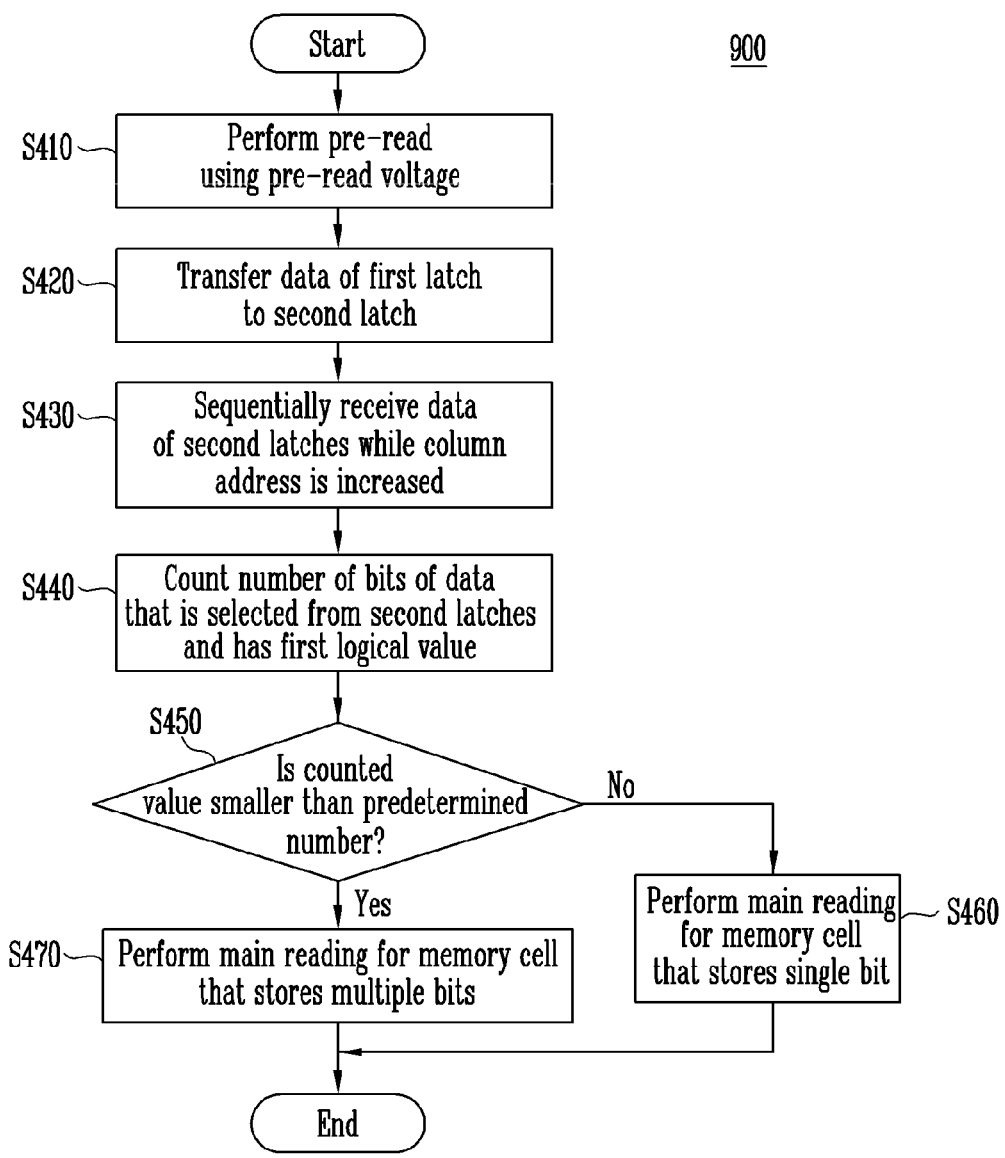
FIG. 9 is a flowchart showing a process of operating page buffers and a control logic of FIG. 8 according to an embodiment.

FIG. 9 is a flowchart showing a process 900 of operating the first to $m^{th}$ page buffers PB1 to PBm and the control logic 125 of FIG. 8.

Referring to FIGS. 8 and 9, first, in operation S410, the program/read scheduler 201 controls the address decoder 121, the voltage generator 122, and the read/write circuit 123 to perform the pre-reading using the pre-read voltage Vpre. The data read using the pre-read voltage Vpre may be stored in the first latch LAT1 of each page buffer.

In operation S420, the program/read scheduler 201 controls the first to $m^{th}$ page buffers PB1 to PBm to transfer the data of the first latch LAT1 of each page buffer to the second latch LAT2. In an embodiment, the second latch LAT2 may be used as a cache latch.

In operation S430, the program/read scheduler 201 sequentially receives the data stored in the second latches LAT2 of the first to $m^{th}$ page buffers PB1 to PBm while a column address provided to the input/output circuit 230 of each page buffer is increased.

In operation S440, the counter 202 counts the number of bits of the selected data having the first logical value, the selected data being stored in the second latches LAT2 of the first to $m^{th}$ page buffers PB1 to PBm.

In operation S450, the comparator 203 compares a count value obtained by the counter 202 and the predetermined number. The comparator 203 enables or disables the enable signal EN according to a result of the comparison. The program/read scheduler 201 performs operation S460 or operation S470 according to the enable signal EN.

When the count value of the counter 202 is greater than or equal to the predetermined number, operation S460 is performed. In operation S460, the program/read scheduler 201 controls the address decoder 121, the voltage generator 122, and the read/write circuit 123 to perform the second main reading adapted to read a memory cell that stores a single bit.

When the count value of the counter 202 is smaller than the predetermined number, operation S470 is performed. In operation S470, the program/read scheduler 201 controls the address decoder 121, the voltage generator 122, and the read/write circuit 123 to perform the first main reading adapted to read a memory cell that stores multiple bits.

Figure 10:
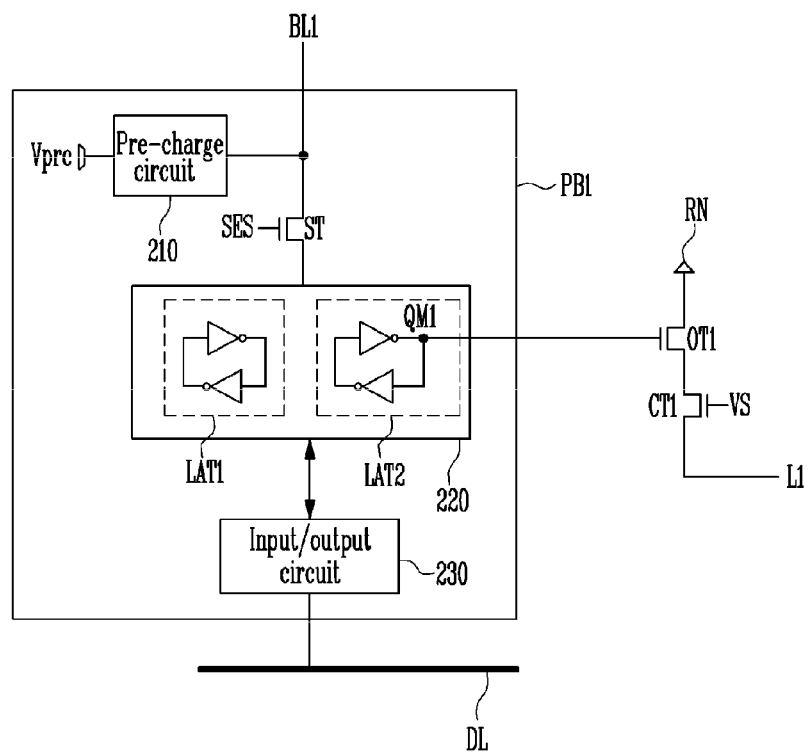
FIG. 10 is a block diagram showing a first output transistor and a first control transistor, which are provided to a first page buffer, according to an embodiment.

FIG. 10 is a block diagram showing a first output transistor OT1 and a first control transistor CT1, which are coupled to a first page buffer PB1.

Referring to FIG. 10, the first page buffer PB1 includes a pre-charge circuit 210, a bit line select transistor ST, a sensing circuit 220, and an input/output circuit 230.

The first output transistor OT1 and the first control transistor CT1 are coupled to the first page buffer PB1. The transistors OT1 and CT1 are connected between a first line L1 and a reference node RN in series. A gate of the first output transistor OT1 is connected to a latch node QM1 of a second latch LAT2. A gate of the first control transistor CT1 is connected to a control signal VS. The control signal VS is provided from the control logic 125 (see FIG. 1). In an embodiment, the reference node RN may have a ground voltage level.

The first output transistor OT1 is turned on according to data latched in the latch node QM1. For example, it is assumed that a corresponding memory cell is read as a first logical value according to the pre-reading using the pre-read voltage Vpre (see FIG. 5). In this case, a logical value "1" may be stored in the latch node QM1. When the logical value "1" is stored in the latch node QM1, the first output transistor OT1 is turned on. When the control signal VS is enabled and then the first control transistor CT1 is turned on, the first line L1 may be electrically connected to the reference node RN. That is, when the control signal VS is enabled, the first line L1 may be electrically connected to the reference node RN according to the data of the latch node QM1.

In the same manner as the first page buffer PB1, the output transistor and the control transistor are provided to each of the second to $m^{th}$ page buffers PB2 to PBm. The output transistors and the control transistors are included in a reflector, as will be described in detail with reference to FIG. 11.

Figure 11:
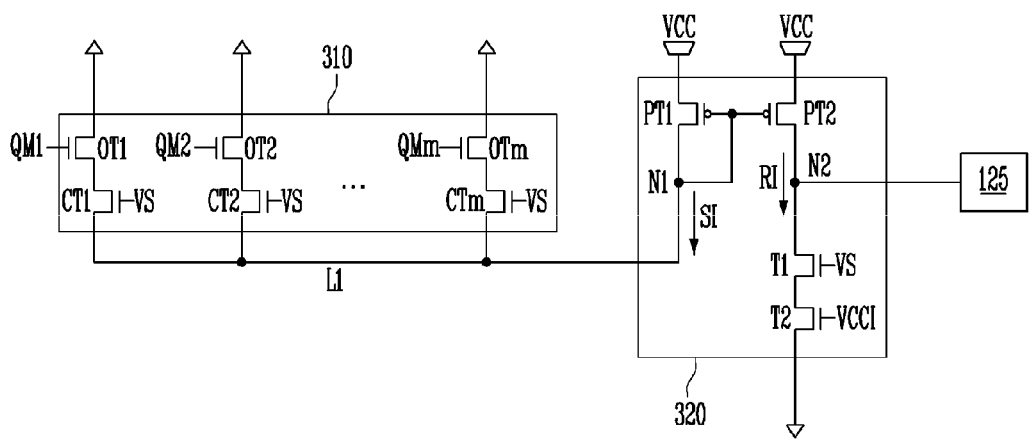
FIG. 11 is a circuit diagram showing a reflector and a current mirror according to an embodiment.

FIG. 11 is a circuit diagram showing a reflector 310 and a current mirror 320 configured to generate a voltage at a second node N2 according to a count of a number of nodes, among first to $m^{th}$ latch nodes QM1 to QMm, having a first logical value.

Referring to FIGS. 1, 10, and 11, the reflector 310 includes first to $m^{th}$ output transistors OT1 to OTm, and first to $m^{th}$ control transistors CT1 to CTm.

The first to $m^{th}$ output transistors OT1 to OTm are connected to the first to $m^{th}$ latch nodes QM1 to QMm, respectively. The first to $m^{th}$ output transistors OT1 to OTm are turned on according to data of the first to $m^{th}$ latch nodes QM1 to QMm, respectively.

Gates of the first to $m^{th}$ control transistors CT1 to CTm are connected to a control signal VS. When the control signal VS is enabled, the first to $m^{th}$ control transistors CT1 to CTm are turned on.

The first line L1 is connected to the reference node RN through the reflector 310. The first line L1 is coupled to a power voltage VCC through the current mirror 320. When the control signal VS is enabled, a sensing current SI which flows through the first line L1 is determined according to the data of the latch nodes QM1 to QMm. That is, when the control signal VS is enabled, the reflector 310 provides the sensing current SI according to the data of the latch nodes QM1 to QMm, on resistances of the first to $m^{th}$ output transistors OT1 to OTm, and on resistances of the first to $m^{th}$ control transistors CT1 to CTm.

The current mirror 320 includes a first P-channel Metal Oxide Semiconductor (PMOS) transistor PT1, a second PMOS transistor PT2, a first N-channel Metal Oxide Semiconductor (NMOS) transistor T1, and a second NMOS transistor T2. The first PMOS transistor PT1 is connected between the power voltage VCC and a first node N1. The first node N1 is connected to the first line L1. A gate of the first PMOS transistor PT1 is connected to a gate of the second PMOS transistor PT2 and also connected to the first node N1, that is, a drain thereof. The second PMOS transistor PT2 is connected between the power voltage VCC and the second node N2.

The first and second NMOS transistors T1 and T2 are connected in series between the second node N2 and the reference node. The first NMOS transistor T1 is turned on in response to the control signal VS. The second NMOS transistor T2 receives a control signal VCCI and is turned on in response to the control signal VCCI.

The sensing current SI is reflected in a reflected current RI. A voltage of the second node N2 is determined according to the reflected current RI and impedance values of the first and second NMOS transistors T1 and T2.

By detecting an amount of the reflected current RI, it may be determined whether the number of memory cells that are read as the first logical value according to the pre-reading is smaller than the predetermined number. The reflected current RI may be transferred to the control logic 125. Depending on an amount of the reflected current RI detected by the control logic 125, the control logic 125 performs either the main reading for the memory cell that stores the multiple bits or the main reading for the memory cell that stores the single bit.

In an embodiment, whether the number of memory cells that are read as the first logical value during the pre-reading is smaller than the predetermined number may be determined by detecting the voltage of the second node N2.

Figure 12:
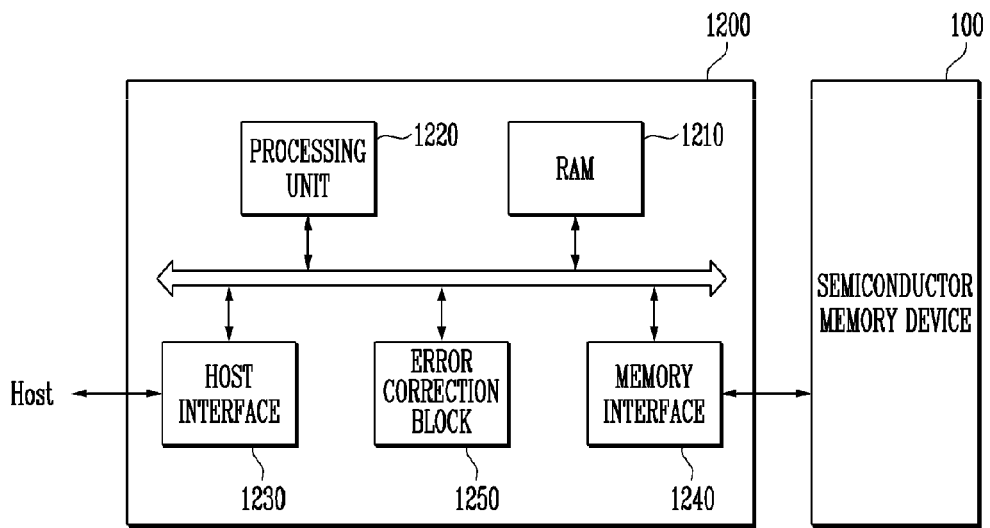
FIG. 12 is a block diagram showing a memory system including the semiconductor memory device of FIG. 1 according to an embodiment.

FIG. 12 is a block diagram showing a memory system 1000 including the semiconductor memory device 100 of FIG. 1.

Referring to FIG. 12, the memory system 1000 includes a semiconductor memory device 100 and a controller 1200.

The semiconductor memory device 100 may be configured and may operate in the same manner as described with reference to FIGS. 1 to 11. Hereinafter, the descriptions thereof will not be repeated.

The controller 1200 is connected to a host Host and the semiconductor memory device 100. The controller 1200 is configured to access the semiconductor memory device 100 in response to a request from the host Host. For example, the controller 1200 is configured to control read, write, erase, and background operations of the semiconductor memory device 100. The controller 1200 is configured to provide an interface between the semiconductor memory device 100 and the host Host. The controller 1200 is configured to control the semiconductor memory device 100 by executing firmware using a processing unit 1220, wherein the firmware includes computer programming instructions stored in a non-transitory computer readable medium.

The controller 1200 includes a random access memory (RAM) 1210, the processing unit 1220, a host interface 1230, a memory interface 1240, and an error correction block 1250.

The RAM 1210 is used as at least one of an operational memory of the processing unit 1220, a cache memory between the semiconductor memory device 100 and the host Host, and a buffer memory between the semiconductor memory device 100 and the host Host.

The processing unit 1220 controls overall operations of the controller 1200.

The processing unit 1220 is configured to balanced-code data received from the host Host. In an embodiment, the processing unit 1220 balanced-codes the data received from the host Host using a seed value. The balanced-coded data is provided to the semiconductor memory device 100 to be programmed in the memory cell array 110 (see FIG. 1).

The processing unit 1220 is configured to balanced-code the data received from the semiconductor memory device 100 during a read operation. For example, the processing unit 1220 balanced-codes the data received from the semiconductor memory device 100 using the seed value. The balanced-coded data is output to the host Host.

In an embodiment, the processing unit 1220 may perform a balanced-coding and a balanced-code decoding by driving software or firmware.

The host interface 1230 includes a protocol to exchange data between the host Host and the controller 1200. In an embodiment, the controller 1200 is configured to communicate with the host Host through at least one of various interface protocols such as a Universal Serial Bus (USB) protocol, a multimediacard (MMC) protocol, a peripheral component interconnect (PCI) protocol, a PCI-express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, a private protocol, and the like.

The memory interface 1240 interfaces with the semiconductor memory device 100. For example, the memory interface 1240 may include a NAND interface or a NOR interface, or both.

The error correction block 1250 is configured to detect and correct an error in data received from the semiconductor memory device 100 using an error correcting code (ECC).

The controller 1200 and the semiconductor memory device 100 may be integrated into one semiconductor device. In an embodiment, the controller 1200 and the semiconductor memory device 100 may be integrated into one semiconductor device and may constitute a memory card. For example, the controller 1200 and the semiconductor memory device 100 may be integrated into one semiconductor device and constitute any of memory cards such as a personal computer (PC) card (personal computer memory card international association (PCMCIA)), a compact flash (CF) card, a smartmedia (SM) card (SMC), a memory stick, an MMC (reduced size MMC (RS-MMC), MMCmicro), a secure digital (SD) card (miniSD, microSD, SD high capacity (SDHC)), a universal flash storage (UFS), and the like.

The controller 1200 and the semiconductor memory device 100 may be integrated into one semiconductor device and may constitute a solid state drive (SSD). The SSD includes a storage device configured to store data in a semiconductor memory. When the memory system 1000 is used as the SSD, an operation speed of the host Host connected to the memory system 1000 is significantly enhanced.

In an embodiment, the memory system 1000 is provided as at least one of various components of any of electronic devices such as a computer, an ultra-mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for wirelessly sending and receiving information, at least one of various electronic devices configuring a home network, at least one of various electronic devices configuring a computer network, at least one of various electronic devices configuring a telematics network, an RFID device, and at least one of various components configuring a computing system, and the like.

In an embodiment, the semiconductor memory device 100 or the memory system 1000 may be mounted using various forms of packages. For example, the semiconductor memory device 100 or the memory system 1000 may be packaged in a package on package (PoP), ball grid arrays (BGAs), chip scale packages (CSPs), a plastic leaded chip carrier (PLCC), a plastic dual inline package (PDIP), a die in waffle pack, a die in wafer form, a chip on board (COB), a ceramic dual inline package (CERDIP), a plastic metric quad flat pack (MQFP), a thin quad flatpack (TQFP), a small outline integrated circuit (SOIC), a shrink small outline package (SSOP), a thin small outline (TSOP), a thin quad flatpack (TQFP), a system in package (SIP), a multi chip package (MCP), a wafer-level fabricated package (WFP), a wafer-level processed stack package (WSP), or the like, and may be mounted.

Figure 13:
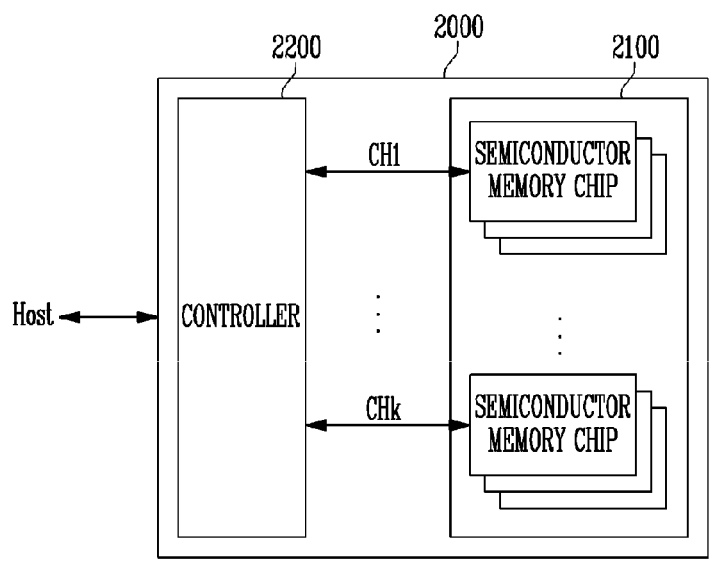
FIG. 13 is a block diagram showing an application example of the memory system of FIG. 12 according to an embodiment.

FIG. 13 is a block diagram showing an application example 2000 of the memory system 1000 of FIG. 12.

Referring to FIG. 13, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 13, the plurality of groups are shown to communicate with the controller 2200 through first to $k^{th}$ channels CH1 to CHk, respectively. Each semiconductor memory chip is configured and operates similarly to the semiconductor memory device 100 described with reference to FIG. 1.

Each group is configured to communicate with the controller 2200 through one common channel. The controller 2200 is configured similarly to the controller 1200 described with reference to FIG. 12 and configured to control the plurality of semiconductor memory chips of the semiconductor memory device 2100 through the plurality of channels CH1 to CHk.

In FIG. 13, the plurality of semiconductor memory chips are connected to one channel. However, it will be understood that the memory system 2000 may be changed such that one semiconductor memory chip is connected to one channel.

Figure 14:
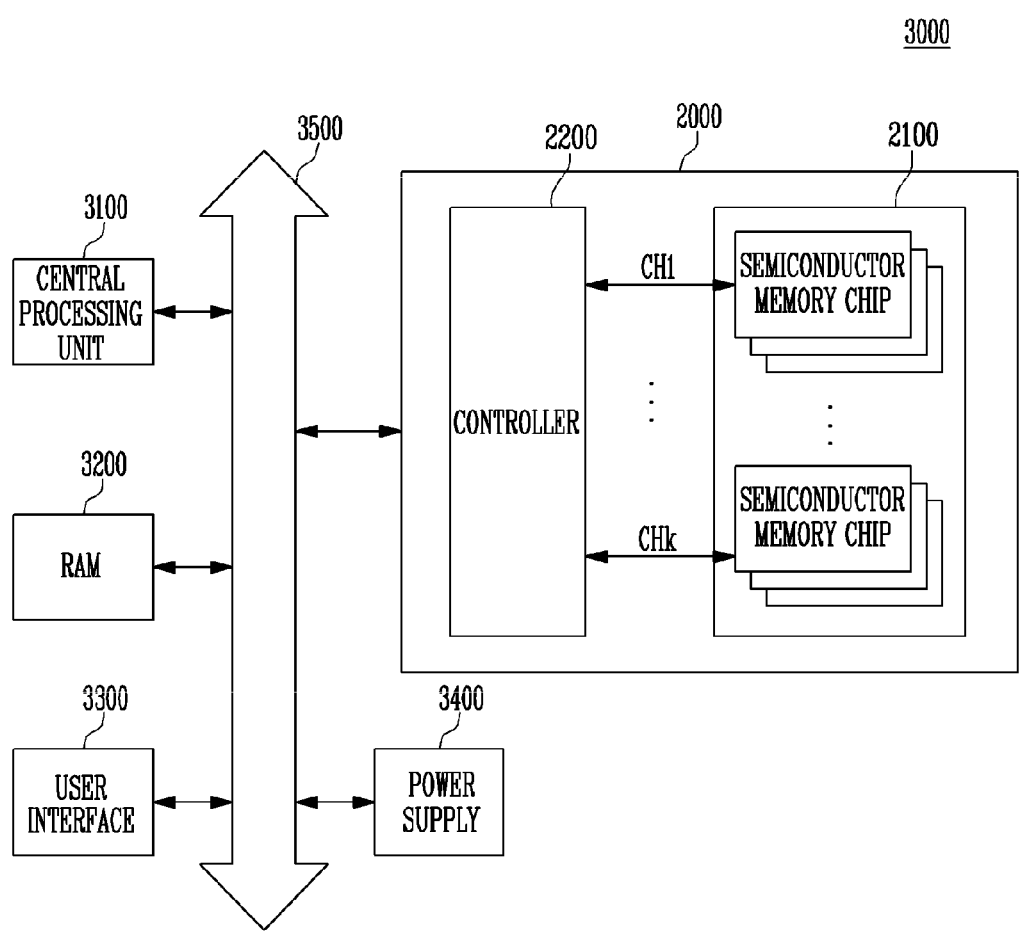
FIG. 14 is a block diagram showing a computing system including the memory system of FIG. 13 according to an embodiment.

FIG. 14 is a block diagram showing a computing system 3000 including the memory system 2000 described with reference to FIG. 13.

Referring to FIG. 14, the computing system 3000 includes a central processing unit 3100, a RAM 3200, a user interface 3300, a power supply 3400, a system bus 3500, and the memory system 2000.

The memory system 2000 is electrically connected to the central processing unit 3100, the RAM 3200, the user interface 3300, and the power supply 3400 through the system bus 3500. Data, which is provided through the user interface 3300 or processed by the central processing unit 3100, is stored in the memory system 2000.

In FIG. 14, the semiconductor memory device 2100 is connected to the system bus 3500 through the controller 2200. However, in another embodiment, the semiconductor memory device 2100 may be configured to be directly connected to the system bus 3500, and a function of the controller 2200 may be performed by the central processing unit 3100 and the RAM 3200.

In FIG. 14, the memory system 2000 described with reference to FIG. 13 is provided. However, the memory system 2000 may be replaced by the memory system 1000 described with reference to FIG. 12. In an embodiment, the computing system 3000 may be configured to include both of the memory systems 1000 and 2000 described with reference to FIGS. 12 and 13, respectively.

According to the embodiments of the present disclosure, the semiconductor memory device having a reduced area and the process of operating the same can be provided.

In the drawings and specification, there have been disclosed illustrative embodiments of the invention, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A semiconductor memory device, comprising:
   a memory cell array including a plurality of memory cells; and
   a peripheral circuit configured to perform a pre-reading, using a pre-read voltage, on memory cells selected from the plurality of memory cells and perform a main reading on the selected memory cells according to a result of the pre-reading,
   wherein the peripheral circuit determines whether the selected memory cells are respectively read as a first logical value or a second logical value by performing the pre-reading, and
   wherein when a number of memory cells read as the first logical value among the selected memory cells is smaller than a predetermined number, the peripheral circuit performs a first main reading adapted to read a memory cell that stores multiple bits.

2. The device of claim 1, wherein the plurality of memory cells store balanced-coded data.

3. The device of claim 1, wherein the predetermined number is greater than half of the number of the selected memory cells by a reliability value.

4. The device of claim 1, wherein a memory cell having a threshold voltage smaller than or equal to the pre-read voltage among the selected memory cells reads as the first logical value, and
wherein a memory cell having the threshold voltage greater than the pre-read voltage among the selected memory cells reads as the second logical value.

5. The device of claim 1, wherein when the number of memory cells read as the first logical value is greater than or equal to the predetermined number, the peripheral circuit performing the main reading includes performing a second main reading adapted to read a memory cell that stores a single bit.

6. The device of claim 1, wherein the pre-read voltage is included in a voltage range between a first upper program state and a second upper program state, and
wherein the memory cell that stores the multiple bits is adapted to have one of an erase state, the first upper program state, the second upper program state, and a third upper program state.

7. The device of claim 1, wherein the pre-read voltage is included in a voltage range of a lower program state, and
wherein a memory cell that stores a single bit is adapted to have one of an erase state and the lower program state.

8. The device of claim 1, wherein the peripheral circuit comprises:
a plurality of page buffers configured to store the first logical value or the second logical value according to a threshold voltage of each of the selected memory cells and the pre-read voltage;
a counter configured to count data bits, the data bits being stored in the plurality of page buffers and having the first logical value; and
a comparator configured to compare a count value obtained by the counter with the predetermined number,
wherein the peripheral circuit performs, according to the result of the comparison, either the first main reading of the selected memory cells or a second main reading of the selected memory cells, wherein the second main reading is adapted to read a memory cell that stores a single bit.

9. The device of claim 1, wherein the peripheral circuit comprises:
a plurality of page buffers configured to store the first logical value or the second logical value according to a threshold voltage of each of the selected memory cells and the pre-read voltage; and
a reflector configured to provide a current determined according to data bits, the data bits being stored in the plurality of page buffers and having the first logical value,
wherein the peripheral circuit performs, according to an amount of the current, either the first main reading of the selected memory cells or a second main reading of the selected memory cells, wherein the second main reading is adapted to read a memory cell that stores a single bit.

10. A method of operating a semiconductor memory device, comprising:
performing a pre-reading on memory cells selected from a plurality of memory cells according to a pre-read voltage and determining whether the selected memory cells each are read as a first logical value or a second logical value;
comparing a number of memory cells read as the first logical value among the selected memory cells with a predetermined number; and
when the number of memory cells read as the first logical value is smaller than the predetermined number, performing a first main reading of the selected memory cells, wherein the first main reading is adapted to read a memory cell that stores multiple bits.

11. The method of claim 10, wherein the plurality of memory cells store balanced-coded data.

12. The method of claim 10, wherein the predetermined number is greater than a half of the number of selected memory cells by a reliability value.

13. The method of claim 10, wherein the determining whether the selected memory cells each are read as a first logical value or a second logical includes:
when a memory cell of the selected memory cells has a threshold voltage lower than or equal to the pre-read voltage, determining that the memory cell is read as the first logical value; and
when the memory cell has the threshold voltage greater than the pre-read voltage, determining that the memory cell is read as the second logical value.

14. The method of claim 10, further comprising when the number of memory cells that are read as the first logical value is greater than or equal to the predetermined number, performing a second main reading of the selected memory cells, wherein the second main reading is adapted to read a memory cell that stores a single bit.

15. The method of claim 10, wherein the pre-read voltage is included in a voltage range between a first upper program state and a second upper program state, and
wherein the memory cell that stores the multiple bits is adapted to have one of an erase state, the first upper program state, the second upper program state, and a third upper program state.

16. The method of claim 10, wherein the pre-read voltage is included in a voltage range of a lower program state, and
wherein a memory cell that stores a single bit is adapted to have one of an erase state and the lower program state.

* * * * *